(12) United States Patent
Johnson et al.

(10) Patent No.: US 7,593,286 B2
(45) Date of Patent: *Sep. 22, 2009

(54) WRITE LATENCY TRACKING USING A DELAY LOCK LOOP IN A SYNCHRONOUS DRAM

(75) Inventors: James Brian Johnson, Boise, ID (US); Feng Lin, Boise, ID (US); Brent Keeth, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/047,756

(22) Filed: Mar. 13, 2008

(65) Prior Publication Data

US 2008/0159058 A1 Jul. 3, 2008

Related U.S. Application Data

(63) Continuation of application No. 11/355,802, filed on Feb. 16, 2006, now Pat. No. 7,355,920.

(51) Int. Cl.
G11C 8/00 (2006.01)
(52) U.S. Cl. .................... 365/233.1; 365/193
(58) Field of Classification Search ............... 365/233.1, 365/193, 194, 189.01
See application file for complete search history.

(56) References Cited

U.S. PATENT DOCUMENTS

| | | | |
|---|---|---|---|
| 6,272,070 B1 | 8/2001 | Keeth et al. | 365/233.5 |
| 6,680,866 B2 | 1/2004 | Kajimoto | 365/189.01 |
| 7,054,222 B2 * | 5/2006 | Li et al. | 365/189.16 |
| 7,113,446 B2 | 9/2006 | Fujisawa | 365/233 |
| 7,355,920 B2 * | 4/2008 | Johnson et al. | 365/233.1 |
| 7,390,712 B2 * | 6/2008 | Basceri et al. | 438/239 |
| 2002/0194520 A1 | 12/2002 | Johnson | 713/600 |
| 2006/0013060 A1 | 1/2006 | Li et al. | 365/233 |

* cited by examiner

*Primary Examiner*—Gene N. Auduong
(74) *Attorney, Agent, or Firm*—Wong, Cabello, Lutsch, Rutherford & Brucculeri, LLP

(57) ABSTRACT

A method and circuitry for improved write latency tracking in a SDRAM is disclosed. In one embodiment, a delay locked loop is used in the command portion of the write path, and receives the system clock as its reference input. The DLL includes a modeled delay which models the delay in transmission of the internal Write Valid signal and system clock distribution to the deserializers in the data path portion of the write path, which is otherwise controlled by the intermittently asserted write strobe signal. With the input distribution delay of the system clock (Clk) and the write strobe (WS) matched by design, the distributed system clock and Write Valid signal are synchronized to the WS distribution path by means of the DLL delay with reference to the system clock input to the DLL. By backing the distribution delay out of system clock as sent to the deserializers, the write valid signal is effectively synchronized with the write strobe, with the effect that data will be passed out of the deserializer circuitry to the memory array on time and consistent with the programmed write latency.

35 Claims, 3 Drawing Sheets

WRITE LATENCY TRACKING USING A DELAY LOCK LOOP IN A SYNCHRONOUS DRAM

CROSS REFERENCE TO RELATED APPLICATIONS

This is a continuation of U.S. patent application Ser. No. 11/355,802, filed Feb. 16, 2006, which is incorporated herein by reference in its entirety and to which priority is claimed.

FIELD OF THE INVENTION

Embodiments of this invention relate to write latency tracking, and specifically synchronization between the system clock and the write strobe, in a Synchronous Dynamic Random Access Memory (SDRAM).

BACKGROUND

SDRAM integrated circuit devices are well known in the art. One embodiment showing major subcircuits in the write path 10 of an SDRAM are shown in FIG. 1. Shown are various relevant bond pads 12 for the SDRAM that allow the SDRAM to be coupled to an outside system via the integrated circuit's packaging (not shown). These bond pads 12 include various signals sent from the outside system (such as a microprocessor), and include: a system clock (Clk); various command signals such as Row Address Strobe (RAS), Column Address Strobe (CAS), Write Enable (WE), and Chip Select (CS); address lines (Ax) for specifying an address in the memory array (not shown) to which data is to be written; data lines (DQx) for providing to the to-be-written data; and a Write Strobe (WS) for toggling the data into the SDRAM. Generally, the write path can be thought of as comprised of two main sections: the data path 6 and the command path 8. As one skilled in the art will recognize, a typical SDRAM will have many more address and data lines than those shown.

The illustrated SDRAM is a Double Data Rate (DDR) SDRAM, meaning that data is latched into the SDRAM (via latches 18a-18c) on both rising and falling edges of the intermittently-asserted Write Strobe. Moreover, as illustrated, the SDRAM has a burst length of four, meaning that four bits are written into each data line per each write command. As a result, notice that the latches 18a-18c are coupled to deserializers 20a-20c. These deserializers 20a-20c serially receive the four burst bits of data from the latches 18a-c and, under control of a deserializer control 22, provide the four bits of data in parallel along busses 23a-23c. With the data deserialized, the data on the buses 23a-23c can be written to the memory array (not shown) at a specified address. While a burst length of four is illustrated for convenience, one skilled will realize that other burst lengths are possible, and can be programmed into the SDRAM. Moreover, one skilled will further realize that while illustrated in the context of a DDR SDRAM for simplicity, the same operational principles apply to DDR2 (i.e., four bits per WS rising/falling edge) and DDR3 (i.e., eight bits per WS rising/falling edge) SDRAM technologies.

Data is written to the illustrated SDRAM through the issuance of a write command, which in turn requires assessment of the various command signals (e.g., RAS, CAS, WE, CS) issued external to the device. For example, in a typical SDRAM, a write command corresponds to /CS='0', /RAS='1', /CAS='0', and /WE='0', although this can differ between various devices. In any event, for the SDRAM to understand that data is to be written at a particular point in time, the command signals must be decoded via command decode 24, which in turn issues an Internal Write command when the conditions for writing have been properly presented to the device.

As is typical of DDR2 SDRAMs, the illustrated SDRAM in FIG. 1 has a write latency. As is known, a write latency is a number of cycles of the system clock (Clk) between the presentation at the pads 12 of a write command and the presentation at the pads 12 of the data corresponding to that write command. The write latency is generally variable as a function of the frequency of the system clock, and can be programmable, but assume for simplicity in the illustrated SDRAM that the write latency is four cycles. If this is the case, the Internal Write command signal is held in check for four cycles by a write latency counter 26, which functions to delay the assertion of the Internal Write command as a Write Valid command on line 28 until the write latency counter has counted four clock cycles.

Once the Write Valid command has been asserted in this fashion, it is presented to the deserializer control 22, which also receives both the system clock (Clk) on line 27. When the Write Valid signal coincides with the rising edge of the system clock, deserializer control 22 enables the deserializers 20 to output the deserialized data in parallel onto the buses 23a. At that point, and in theory, the data on the buses 23 is written into the array at the address earlier presented to the device.

This basic scheme and circuitry for the write path 10 of a SDRAM as shown in FIG. 1 is not optimal, particularly at high system clock frequencies. Specifically, a problem results from a potential lack of synchronization between the data path 6 and the command path 8, and more specifically from a lack of synchronization between the Write Valid signal and the Write Strobe. Without proper Write Valid to Write Strobe alignment, it is possible that the deserializer control 22 will enable the data drivers in the deserializers 20 to drive data on the parallel bus 23 misaligned to the incoming data from the data capture latches 18 and the deserializer circuits 20, with the result that incorrect data may be presented at the parallel buses 23. A particular problem is presented when the delay in presentation of the Write Valid signal to the deserializer control 22 is on the order of the system clock period.

However, while it is important to align the Write Valid signal with the Write Strobe signal, this is difficult to accomplish in a typical SDRAM. One reason it is hard to align these two signals is that the Write Valid signal is ultimately generated from the system clock (Clk), which itself may not be aligned to the Write Strobe despite best efforts by the external system to do so. In fact, such synchronization between the system clock and the Write Strobe is not easily attained, because unlike the system clock in the command path 8, the Write Strobe in the data path 6 is not a continually-running clock. Instead, the Write Strobe is issued by the external system only intermittently in burst form during a write.

Another reason that it is hard to align these two signals is that the Write Valid signal must travel a very long distance along the device from its point of assertion (i.e., from write latency command 26) to its point of receipt (i.e., at the deserializer control 22). This is because the system clock (Clk), command latches (18d), command decode 24 and write latency counter 26, generally are laid out at a central location on the device, while the data input latches (18a-c), deserializers (20a-c), and deserializer control 22 are generally laid out at peripheral locations. As a result, timing the arrival of the Write Valid signal at the deserializer control 22 can and will vary appreciably due to process variations, whereas the arrival of the Write Strobe signal, which travels only a relatively short distance to the deserializer control 22, will be more predictable and less variant.

(It should be noted in passing that the system clock, Clk, too must travel essentially the same long distance along line 27 than does the Write Valid signal on line 28. However, to ensure proper timing between these two signals at the deserializer, extra delay (not shown) is typically added to the Write Valid signal line 28 to ensure that it arrives at the deserializer control 22 correctly aligned to the distributed system clock 27. Because these signals travel along essentially the same path, they are equally affected by processing variations, and hence are always generally synchronized at the deserializer control 22).

Previous solutions to this write latency tracking synchronization problem have involved the use of delays to match the write decode path with the data path. However, such routing delays can become much greater than the period of the system clock. This can lead to timing errors for write latency estimation, particularly when process, voltage, and temperature gradients across the SDRAM are considered.

SUMMARY

A method and circuitry for improved write latency tracking in a SDRAM is disclosed. In one embodiment, a delay locked loop is used in the command portion of the write path, and receives the system clock as its reference input. The DLL includes a modeled delay which models the delay in transmission of the internal Write Valid signal and system clock distribution to the deserializers in the data path portion of the write path, which is otherwise controlled by the intermittently asserted write strobe signal. With the input distribution delay of the system clock (Clk) and the write strobe (WS) matched by design, the distributed system clock and Write Valid signal are synchronized to the WS distribution path by means of the DLL delay with reference to the system clock input to the DLL. By backing the distribution delay out of system clock as sent to the deserializers, the write valid signal is effectively synchronized with the write strobe, with the effect that data will be passed out of the deserializer circuitry to the memory array on time and consistent with the programmed write latency.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1:
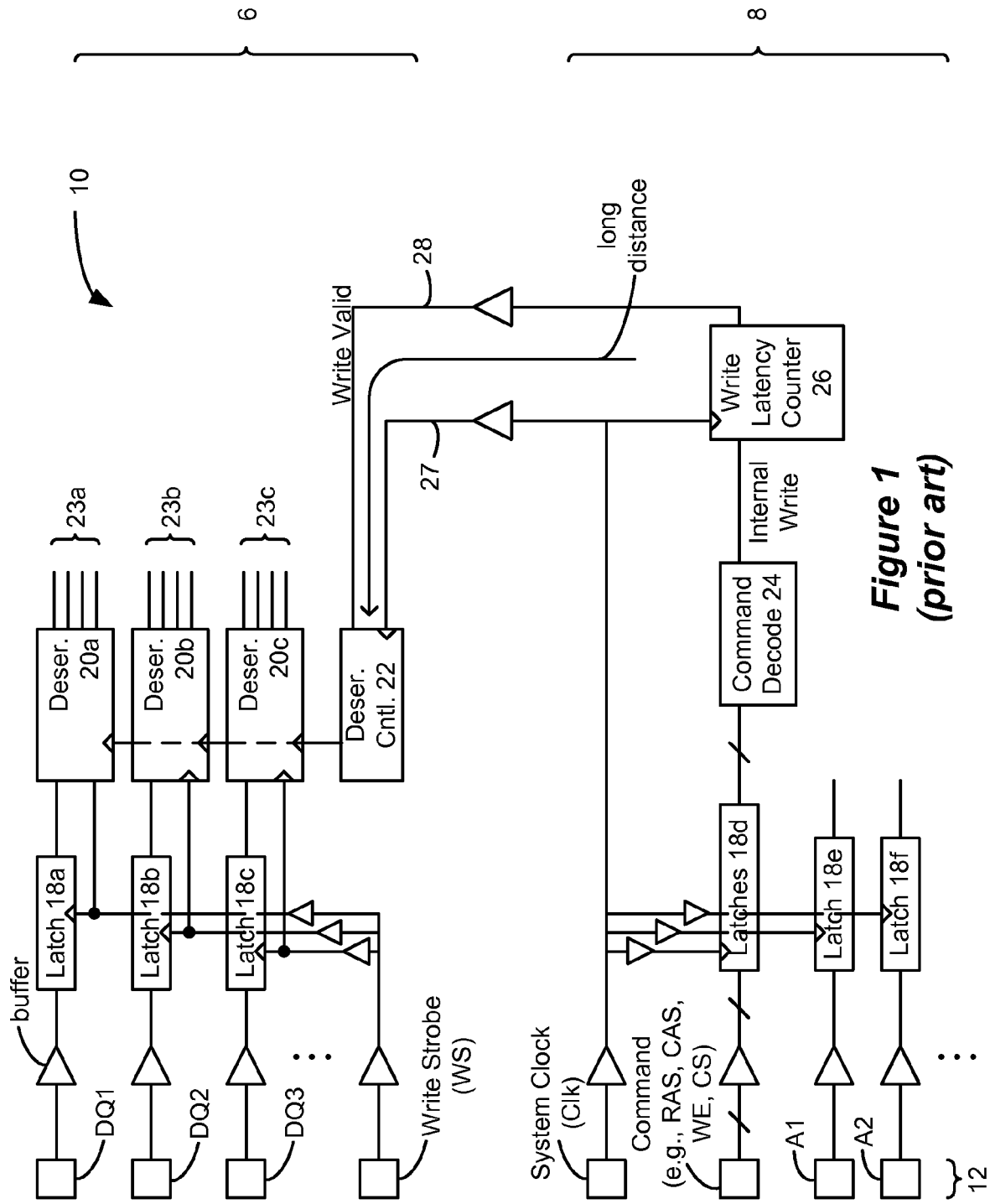
FIG. 1 illustrates a prior art write path for an SDRAM, and illustrates how write latency is tracked.
Figure 2:
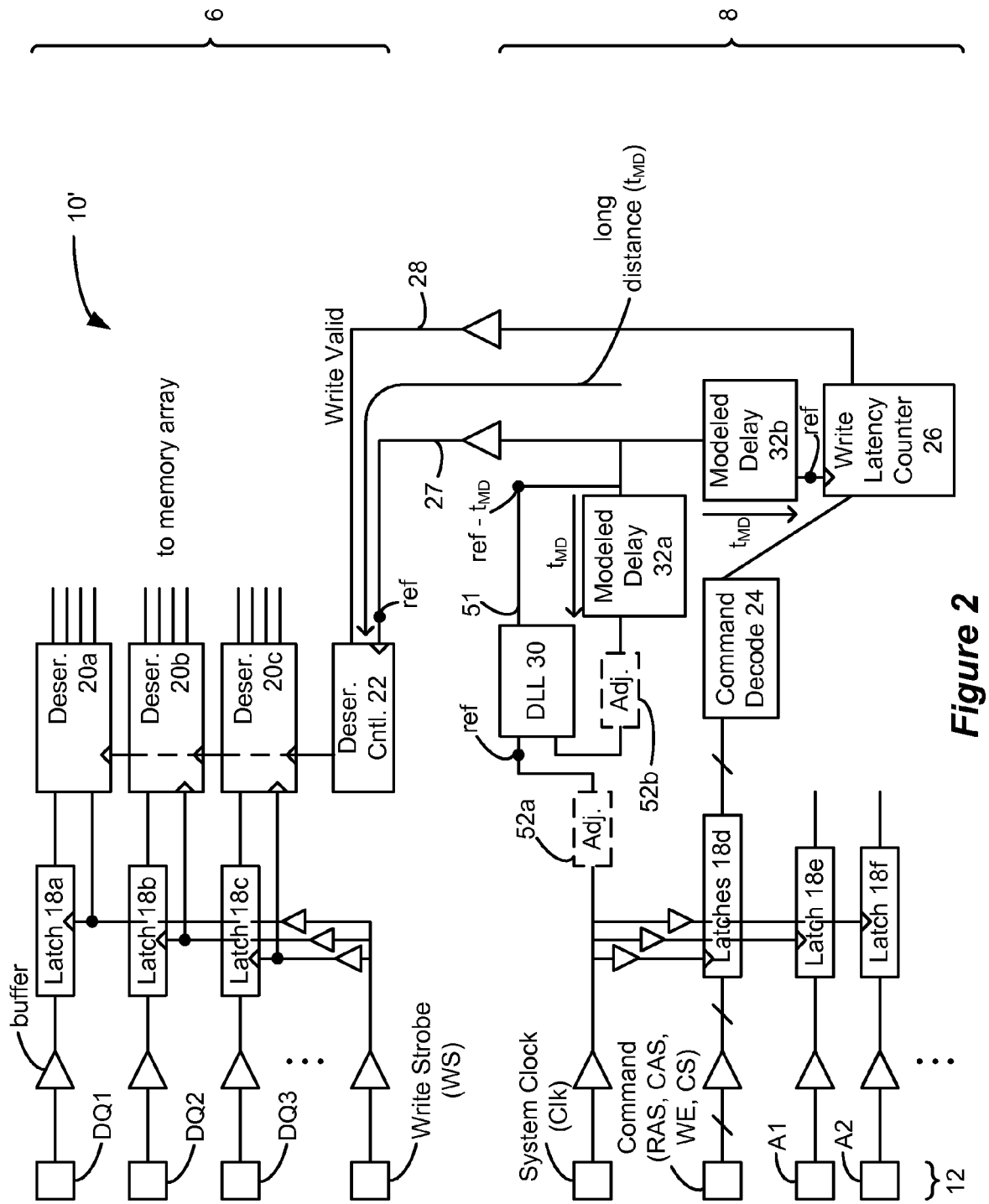
FIG. 2 illustrates an embodiment of an improved write path for an SDRAM which in accordance with the invention, and which uses a delay locked loop (DLL) to improve write latency tracking.

An implementation of the improved write path circuitry 10' is shown in FIG. 2. Because many of the components in the improved write path circuit 10' are the same as those discussed above with respect to FIG. 1, they are not again discussed.

As shown, and in contradistinction to the prior art, the improved write path circuitry 10' incorporates a delay locked loop (DLL) 30. DLLs such as DLL 30 are well known in the art as a means for generating an output clock signal from an input clock signal, wherein the phase between the two can be tightly controlled. Because DLL circuits are well known, their functionality and basic structure is not further discussed, although the reader can refer to the following references for further details, which references are incorporated by reference in their entireties: U.S. Pat. No. 6,680,874; U.S. patent application Ser. No. 10/894,269, filed Jul. 19, 2004; Ser. No. 11/107,587, filed Apr. 15, 2005; and Ser. No. 11/124,743, filed May 9, 2005.

The DLL 30 is used to align the distributed system clock 27 with the Write Strobe so that decoded write commands can be timed to match arrival of data to the SDRAM at the programmed latency. This can be done independently of the capture and deserialization of the write data, with the result that commands received in the system clock domain are temporally aligned to data captured in the write strobe domain.

This occurs as follows. Ignoring adjustment blocks ("Adj") 52a and 52b for the moment, the DLL 30 receives a buffered version of the system clock (ref) as its input, and outputs an output clock 51. The buffered system clock, ref, has a distribution delay that is nominally equal to the distribution delay of the system clock (Clk) and the Write Strobe (WS) from the input pads to the capture latches 18. As is typical in DLLs, the output clock 51 is fed back into the DLL 30. This feedback loop employs a modeled delay 32a, which imparts a time delay ($t_{MD}$) to the output clock 51 before it is fed back into the DLL 30. Because the DLL 30 will seek to keep the two input clocks in phase with one another, the result is that output clock 51 will lead the reference clock (ref) by the delay imparted by the modeled delay 32a, $t_{MD}$.

As its name suggests, modeled delay 32a models a delay within the improved write path circuit 10', and more specifically, it models the delay imparted by the very long distance that the Write Valid (path 28) and the deserializer control clock (on path 27) must travel. In other words, the modeled delay 32a models the delay of $t_{MD}$ experienced along paths 27 and 28, which are essentially equal. In this regard, modeled delay 32a can be constructed in several different ways to affect a delay of $t_{MD}$. In one simple way, the modeled delay can be made to incorporate the very same circuitry that is included in paths 27 and 28, and thus may include the same length of the conductors used in the paths and any buffers. So that the modeled delay 32a will not take up an inordinate amount of space, mimicking the length of the conductors in paths 27 and 28 can be effectuated by the use of serpentine structures as is well known in the art for imparting a delay to a signal. Of course, this is merely an exemplary way of fashioning a modeled delay 32a, and no particular way is of particular importance to the invention.

A modeled delay 32b is also used between the DLL 30's output clock 51 and the clock input of the write latency counter 26. This second modeled delay 32b is in a preferred embodiment no different from modeled delay 32a used in the DLL 30's feedback path, and indeed the two delays 32a, and 32b can be shared between the two.

With the basics of the improved write path circuits 10' now understood, its functionality can be better explained. As stated above, the DLL 30 derives an output clock signal 51 which leads the reference clock, ref, by amount $t_{MD}$ (i.e., ref-$t_{MD}$). Because this output clock is sent through path 27, which itself has a natural delay of $t_{MD}$ due to its long length, buffer circuits, etc., the result is that the leading nature of output 51 is canceled out, such that the reference clock, ref, is provided to the clocking input of the deserializer control 22.

Similarly, because the output clock 51 is fed through modeled delay 32b on route to the clocking input of the write latency counter 26, the leading nature of output 51 is again canceled, such that the reference clock, ref, is provided to the clocking input of the write latency counter 26. This is sensible, because the write latency counter 26 should operate in the reference clock timing domain which also governs the control of the command latches 18d. Because the clocking input to the write latency counter 26 is essentially in the same timing domain as is the prior art, the Write Valid command will be asserted by the write latency counter 26, and will be received at the deserializer control 22, at the same time as does the Write Valid command of the prior art (FIG. 1).

However, the clocking input to the deserializer control 22, when compared to the prior art, will arrive sooner along path 27 relative to the Write Strobe, WS. As a result, the assertion of the Write Valid signal is more likely to be recognized by the deserializer control 22 when aligned to the correct WS cycle as per the programmed write latency. As a result, the write latency is better assured of accurate tracking. Moreover, because the DLL 30 compensates for variations in process, voltage, and temperature, write latency tracking is established in a manner not significantly susceptible to such variations.

In short, the decoded write command, Write Valid, is aligned with data arrival internally to the SDRAM. Essentially, because the DLL 30 addresses the delay inherent in the distribution of the Write Valid command, the write latency counter 26 is effectively synchronized with the write strobe, which effectively places the write command decoding circuitry into the same time domain as is the data capture path circuitry.

Adjustment blocks ("Adj") 52a and 52b are delay elements, and preferably adjustable delay elements, for finely adjusting the delay of the inputs to the DLL 30. While not strictly necessary in all embodiments of the invention, adjustment blocks 52a and 52b can be used to fine tune the circuitry if needed.

Figure 3:
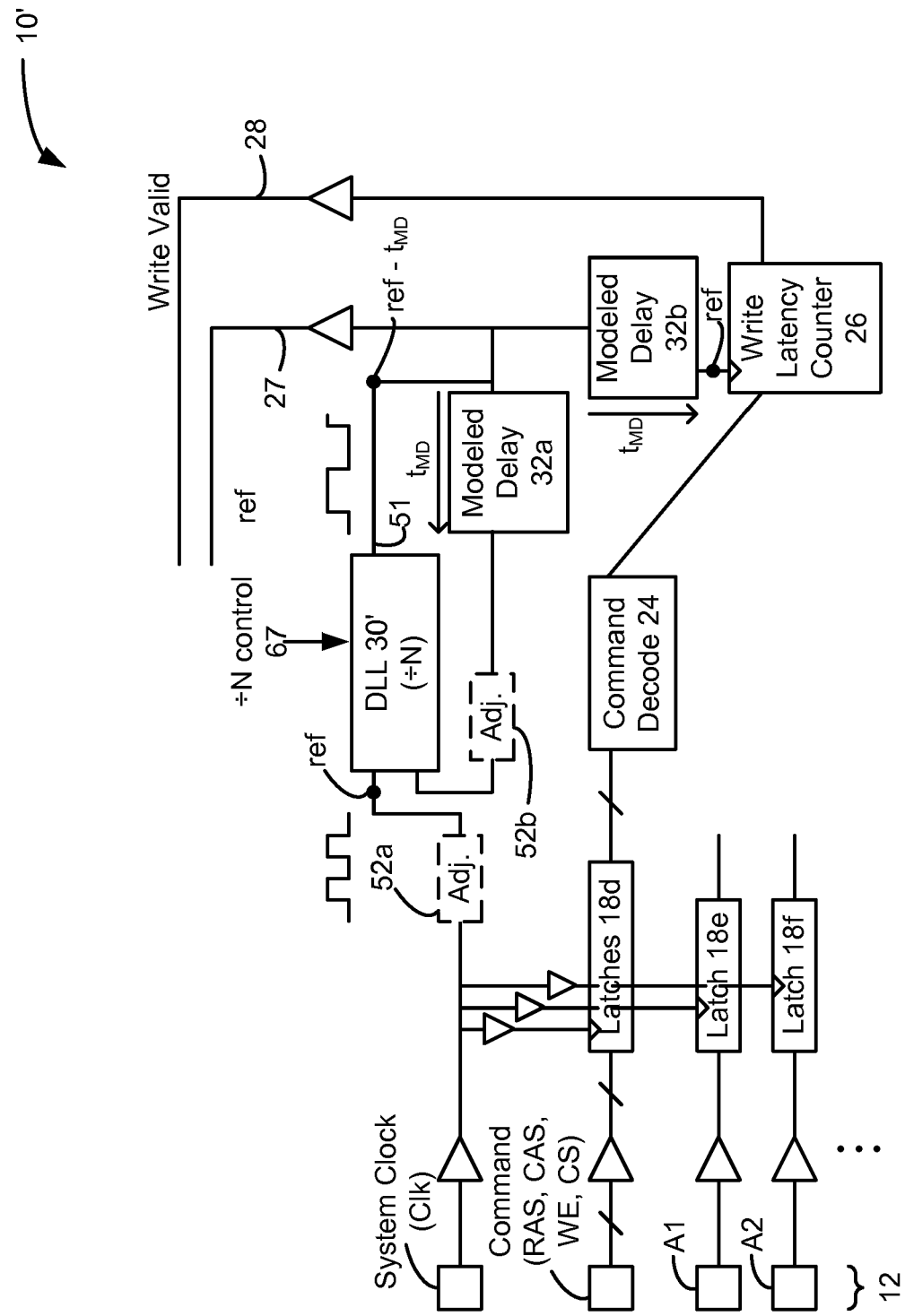
FIG. 3 illustrates a modification to the circuitry of FIG. 2 in which the DLL additionally divides the system clock frequency to improve the margin of write latency tracking.

A modified DLL 30' useful in write latency tracking is provided in FIG. 3. As shown, the DLL 30' in this embodiment is capable of dividing the frequency of the output clock signal 51 by a factor of N. In other words, not only does the DLL 30' perform the timing adjustment function described earlier, it additionally scales up the period of the system clock. This is especially useful if the distribution path delay $t_{MD}$ is larger than a period of the system clock. Should this extreme condition occur, dividing the system clock in this manner adds margin and makes write latency tracking even simpler and more reliable. It should be noted that the use of a DLL 30' with frequency-dividing capability is not new in the art, and an example of such a DLL can be found in above-incorporated U.S. Pat. No. 6,680,874.

While illustrated in the context of a memory integrated circuit such as a DDR2 SDRAM, it should be understood that the disclosed technique can be applied to any sort of integrated circuit having a memory cells or registers, etc. (collectively understood as memory arrays). For example, the disclosed technique could be used in a microprocessor or microcontroller integrated circuit.

While a preferred embodiment of the invention has been disclosed, it should be understood the circuitry as disclosed herein can be modified while still achieving the various advantages discussed herein. In short, it should be understood that the inventive concepts disclosed herein are capable of many modifications. To the extent such modifications fall within the scope of the appended claims and their equivalents, they are intended to be covered by this patent.

What is claimed is:

1. An integrated circuit having a memory array, comprising:
   a data path for receiving input data; and
   a command path for issuing a write valid command on a first distribution path and a first clock signal on a second distribution path, wherein the write valid command and the first clock signal control the timing of writing of the input data from the data path into the memory array,
   wherein a delay locked loop generates the first clock signal from a system clock.

2. The integrated circuit of claim 1, wherein the first clock signal leads the system clock via a delay through the first or second distribution paths.

3. The integrated circuit of claim 2, wherein the delays through the first or second distribution paths are essentially equal.

4. The integrated circuit of claim 1, wherein the data path includes deserializers from which the input data is written into the memory array.

5. The integrated circuit of claim 1, wherein the write valid command comprises a version of a decoded write command delayed in accordance with a write latency.

6. The integrated circuit of claim 1, wherein the delay locked loop includes a feedback loop with a modeled delay for modeling a delay in either the first and second distribution paths.

7. The integrated circuit of claim 1, wherein the first clock signal comprises a frequency that is integer-divided from a frequency of the system clock.

8. The integrated circuit of claim 1, wherein the system clock is issued external to the integrated circuit.

9. An integrated circuit having a memory array, comprising:
   a data path for receiving input data at a plurality of deserializers;
   a command path for issuing a write valid command on a second distribution path in accordance with a second clock signal, and for issuing a first clock signal on a first distribution path; and
   a deserializer control for clocking the deserializers to write the input data into the memory array in accordance with the write valid command and the first clock signal,
   wherein the first clock leads the second clock by an amount of delay in either the first or second distribution paths.

10. The integrated circuit of claim 9, wherein the delays through the first or second distribution paths are essentially equal.

11. The integrated circuit of claim 9, wherein the write valid command comprises a version of a decoded write command delayed in accordance with a write latency.

12. The integrated circuit of claim 9, wherein a delay locked loop causes the first clock to lead the second clock, wherein the delay locked loop includes a feedback loop with a modeled delay for modeling a delay in either the first and second distribution paths.

13. The integrated circuit of claim 9, wherein the first clock signal comprises a frequency that is integer-divided from a frequency of a system clock.

14. A method for writing data into a memory array in an integrated circuit, the integrated circuit receiving a system clock, the method comprising:

receiving input data;
forming a write valid signal in a first clock timing domain by delaying the write command in accordance with a write latency;
forming a phase-shifted version of the system clock in a second timing domain; and
clocking the input data through deserializer circuitry to the memory array in accordance with the write valid signal and the phase-shifted version of the system clock.

15. The method of claim 14, wherein the phase-shifted version of the system clock leads the system clock by a delay involved in sending the write valid signal and the phase-shifted version of the system clock to the deserializer circuitry.

16. The method of claim 14, wherein the write valid signal is formed by a write latency counter.

17. The method of claim 16, wherein the write latency counter is clocked with a clocking signal in the first clock timing domain.

18. The method of claim 14, wherein the phase-shifted version of the system clock additionally comprises a frequency that is integer-divided from a frequency of the system clock.

19. A method for writing data into a memory array in an integrated circuit, the integrated circuit receiving a system clock, the method comprising:
receiving input data at a data path;
issuing a write valid signal in a first clock timing domain;
forming a phase-shifted version of the system clock in a second timing domain; and
sending the phase-shifted version of the system clock and the write valid signal to the data path to capture the data for writing into the memory array.

20. The method of claim 19, wherein the phase-shifted version of the system clock and the write valid signal are received at deserializer circuitry in the data path.

21. The method of claim 19, wherein the data path includes latches for latching the input data in accordance with a write strobe signal.

22. The method of claim 19, wherein issuing a write valid signal comprises delaying assertion of a write command in accordance with a write latency of the integrated circuit.

23. The method of claim 19, wherein the phase-shifted version of the system clock leads the system clock by a delay involved in sending the phase-shifted version of the system clock and the write valid signal to the data path.

24. The method of claim 19, wherein the write valid signal is formed by a write latency counter.

25. The method of claim 24, wherein the write latency counter is clocked in the first clock timing domain.

26. A method for writing data into a memory array in an integrated circuit, the integrated circuit receiving a system clock, the method comprising:
receiving input data at a data path;
issuing a write valid signal in accordance with a first clock generated from a system clock issued external to the integrated circuit;
forming a second clock which leads the first clock, wherein the second clock is formed from the first clock using a delay locked loop and leads by a propagation delay imposed by a distribution path; and
sending the second clock and the write valid signal through the distribution path to the data path to capture the data for writing into the memory array.

27. The method of claim 26, wherein the write valid signal is issued by a latency counter.

28. The method of claim 26, wherein the second clock and the write valid signal are received at deserializer circuitry in the data path.

29. The method of claim 26, wherein the data path includes latches for latching the input data in accordance with a write strobe signal.

30. The method of claim 26, wherein the leading version of the system clock additionally comprises a frequency that is integer-divided from a frequency of the system clock.

31. A method for writing data into a memory array in an integrated circuit, the integrated circuit receiving a system clock, the method comprising:
receiving input data at a data path;
issuing a write valid signal from a write latency counter under control of a first clock;
forming a second clock, wherein the second clock leads the first clock by a propagation delay imposed by a distance; and
sending the second clock and the write valid signal through the distance to the data path to capture the data for writing into the memory array.

32. The method of claim 31, wherein the second clock and the write valid signal are received at deserializer circuitry in the data path.

33. The method of claim 31, wherein the data path includes latches for latching the input data in accordance with a write strobe signal.

34. The method of claim 31, wherein the write latency counter is clocked by the first clock.

35. The method of claim 31, wherein the second clock additionally comprises a frequency that is integer-divided from a frequency of the system clock.

* * * * *